(12) United States Patent
Elad et al.

(10) Patent No.: US 8,988,166 B2
(45) Date of Patent: Mar. 24, 2015

(54) STRUCTURE AND COMPACT MODELING OF VARIABLE TRANSMISSION LINES

(75) Inventors: Danny Elad, Moshav Liman (IL); David Goren, Nesher (IL); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 577 days.

(21) Appl. No.: 13/251,256

(22) Filed: Oct. 2, 2011

(65) Prior Publication Data

US 2013/0082802 A1   Apr. 4, 2013

(51) Int. Cl.
| | | |
|---|---|---|
| H01P 1/18 | (2006.01) | |
| H01P 3/08 | (2006.01) | |
| H01P 3/00 | (2006.01) | |

(52) U.S. Cl.
CPC *H01P 1/18* (2013.01); *H01P 3/003* (2013.01); *H03J 2200/10* (2013.01)
USPC ............................ 333/161; 333/164; 333/238

(58) Field of Classification Search
CPC ........... H01P 3/081; H01P 5/028; H01P 1/18; H01P 3/003; H03J 2200/10
USPC ........... 333/236, 238, 246, 4, 5, 33, 156, 161, 333/164, 202–205
See application file for complete search history.

(56) References Cited

U.S. PATENT DOCUMENTS

| | | | |
|---|---|---|---|
| 6,060,939 A | 5/2000 | Woeste et al. | |
| 6,816,031 B1 | 11/2004 | Miller | |
| 7,080,340 B2 | 7/2006 | Goren et al. | |
| 7,392,490 B2 | 6/2008 | Gordin et al. | |
| 7,434,186 B1 | 10/2008 | Goren et al. | |
| 7,724,110 B2 | 5/2010 | Abbaspour-Tamijani et al. | |
| 7,797,662 B2 | 9/2010 | Gordin et al. | |
| 2008/0204168 A1 | 8/2008 | Kawai et al. | |
| 2009/0175378 A1 | 7/2009 | Staszewski et al. | |
| 2009/0195327 A1* | 8/2009 | Cho et al. ........................ | 333/34 |
| 2009/0315641 A1* | 12/2009 | Ding et al. .................... | 333/161 |

FOREIGN PATENT DOCUMENTS

| | | |
|---|---|---|
| CN | 20051007026 | 2/2008 |
| WO | 2009019795 | 2/2009 |
| WO | 2010008742 | 1/2010 |
| WO | 2010025778 | 3/2010 |

OTHER PUBLICATIONS en.wikipedia.org/wiki/Mutual_capacitance : Access on Apr. 11, 2014 : Explanation of Mutual Capacitance.*

(Continued)

*Primary Examiner* — Benny Lee
*Assistant Examiner* — Jorge Salazar, Jr.

(57) ABSTRACT

A novel and useful fabricated variable transmission line that is tuned digitally is presented. Digital tuning of the variable transmission line enables the compensation of process variation in both the active and passive devices of the RF design. Along with several embodiments of the variable transmission line, the present invention also provides a method of compact modeling of the variable transmission line. The variable transmission line structure and compact modeling enables circuit level simulation using a parametric device that in one embodiment can be included as an integral part of a silicon foundry design kit.

17 Claims, 5 Drawing Sheets

(56) References Cited

OTHER PUBLICATIONS

Young-Hoon et al., "Variable ZC transmission line and its application to a tunable impedance transformer", Microwave Conference, Oct. 2005 European, vol. 2, 4 pp. URL: http://ieeexplore.ieee.org/xpl/freeabs_all.jsp?arnumber=1610070.

LaRocca et al., "Millimeter-wave CMOS digital controlled artificial dielectric differential mode transmission lines for reconfigurable ICs", Microwave Symposium Digest, 2008 IEEE MTT-S International, Jun. 2008 pp. 181-184.

Woods et al., "Analysis and measurement of a novel on-chip variable delay transmission line with fixed characteristic impedance",Topical Meeting on Silicon Monolithic Integrated Circuits in RF Systems (SiRF), Jan. 2010, pp. 220-223. URL: http://ieeexplore.ieee.org/xpl/freeabs_all.jsp?arnumber=5422949.

Jeong et al., "Tunable Impedance Transformer Using a Transmission Line With Variable Characteristic Impedance", IEEE Transactions on Microwave Theory and Techniques, Aug. 2005, pp. 2587-2593. URL: http://ieeexplore.ieee.org/xpl/freeabs_all.jsp?arnumber=1492658.

Yun, Y., "Short-wavelength transmission line with variable characteristic impedance for application to matching components on MMIC", Electronics Letters, vol. 46, Issue. 6, Mar. 18, 2010, pp. 423-425. URL: http://ieeexplore.ieee.org/xpl/freeabs_all.jsp?arnumber=5434624.

Zwick et al., "On-Chip Transmission Line Measurement and Modeling in IBM SiGe Technology up to 110[GHz]", IEEE Microwave and Wireless Components Letters, Feb. 2005, vol. 15, Issue. 2, pp. 65-67.

Sayag et al., "Slow Wave transmission lines on silicon with grounded and floating substrate-shields: experimental and electromagnetic simulation", IEEE, T-MTT, 2007.

Goren et al, "An Interconnect-Aware Methodology for Analog and Mixed Signal Design, Based on High Bandwidth (Over 40GHz) On-Chip Transmission Line Approach", Proceedings Design, Automation and Test in Europe Conference and Exhibition, pp. 804-811, Paris (2002).

Gordin et al., "Modeling of On-Chip Transmission Lines in High-Speed A&MS Design—The Low Frequency Induction Calculation",IEEE Signal Propagation on Interconnect Conference, pp. 129-132, Pisa (2002).

Goren et al., "Interconnect-Aware Design Methodology for Analog and Mixed Signal Design in Silicon Based Technologies using High Bandwidth On-Chip Transmission Lines", The 22nd Convention of Electrical and Electronics Engineers in Israel, Dec. 2002.

Gordin et al., "Study of On-Chip Coplanar Transmission Lines over the Lossy Silicon Substrate", IEEE Signal Propagation on Interconnects conference, Siena (2003).

D.Goren et al, "On-Chip Interconnect-Aware Design and Modeling Methodology based on High Bandwidth Transmission Line Devices", IEEE DAC 2003 conference, Anaheim (2003).

Gordin et al., "Modeling Capacitance of On-Chip Coplanar Transmission Lines over the Silicon Substrate", IEEE Signal Propogation on Interconnects Conference (2004).

Goren et al., "The Closed Environment Concept in VLSI On-Chip Transmission Lines Design and Modeling", IEEE SPI 2006 conference, Berlin, May 2006.

Goren et al., "Silicon-chip Single and Coupled Coplanar Transmission Line Measurement and Model Verification up to 50GHz", IEEE SPI 2007 conference, Genova, Italy, May 2007.

D.Goren, B.Sheinman, W.Woods, J.Rasco and S.Shlafman "On-Chip CMOS Coplanar Transmission Line Measurement and Model Verification up to 50GHz", IEEE international COMCAS conference, Tel Aviv, 2008.

\* cited by examiner

US 8,988,166 B2

STRUCTURE AND COMPACT MODELING OF VARIABLE TRANSMISSION LINES

GOVERNMENT INTERESTS

The subject matter disclosed herein may have been created during the performance of a cooperative research and development agreement with the Department of the Air Force Contract FA8650-090-C-7924. The government of the United States may have certain rights to the disclosed subject matter.

FIELD OF THE INVENTION

The present invention relates to the field of circuit design, and more particularly relates to a structure and model for variable transmission lines.

SUMMARY OF THE INVENTION

The present invention provides a fabricated variable transmission line that is digitally tuned. Digital tuning of the transmission line enables the compensation of process variation in both the active and passive devices of the RF design. Along with several embodiments of the variable transmission line, the present invention also provides a method of compact modeling. The variable transmission line structure and compact modeling enables circuit level simulation using a parametric device that in one embodiment can be included as an integral part of a silicon foundry design kit. Variable transmission lines provide several advantages including enabling more accurate RFIC design in silicon technologies that have high variability.

There is thus provided in accordance with the invention, a variable transmission line comprising a semiconductor substrate, a signal line, a first plurality of capacitor ports below the signal line, each capacitor port operative to be connected to either ground or a floating potential, a bottom ground plane and one or more side shield wires.

There is also provided in accordance with the invention, a variable transmission line comprising a semiconductor substrate, a signal line, plurality of capacitor ports below the signal line, each capacitor port operative to be connected to either ground or a floating potential, a bottom ground plane, one or more side shield wires surrounding the signal line and wherein characteristic impedance of the transmission is tuned by connecting each capacitor port to either ground or a floating potential and maintaining constant the one or more side shield wires.

There is further provided in accordance with the invention, a variable transmission line comprising a semiconductor substrate, a signal line, a plurality of capacitor ports that substantially surround the signal line forming a tunnel like structure, each capacitor port operative to be connected to either ground or a floating potential, a bottom ground plane, one or more side shield wires surrounding the signal line and wherein characteristic impedance of the transmission is tuned by connecting one or more of the plurality of capacitor ports to either ground or a floating potential and maintaining constant the one or more side shield wires.

BRIEF DESCRIPTION OF THE DRAWINGS

The invention is herein described, by way of example only, with reference to the accompanying drawings, wherein.

DETAILED DESCRIPTION OF THE INVENTION

The present invention provides a fabricated variable transmission line that is digitally tuned. Digital tuning of the transmission line enables the compensation of process variation in both the active and passive devices of the RF design. Along with several embodiments of the variable transmission line, the present invention also provides a method of compact modeling. The variable transmission line structure and compact modeling enables circuit level simulation using a parametric device that in one embodiment can be included as an integral part of a silicon foundry design kit. The use of variable transmission lines provide several advantages including enabling more accurate RFIC design in silicon technologies that have high variability.

Figure 1:
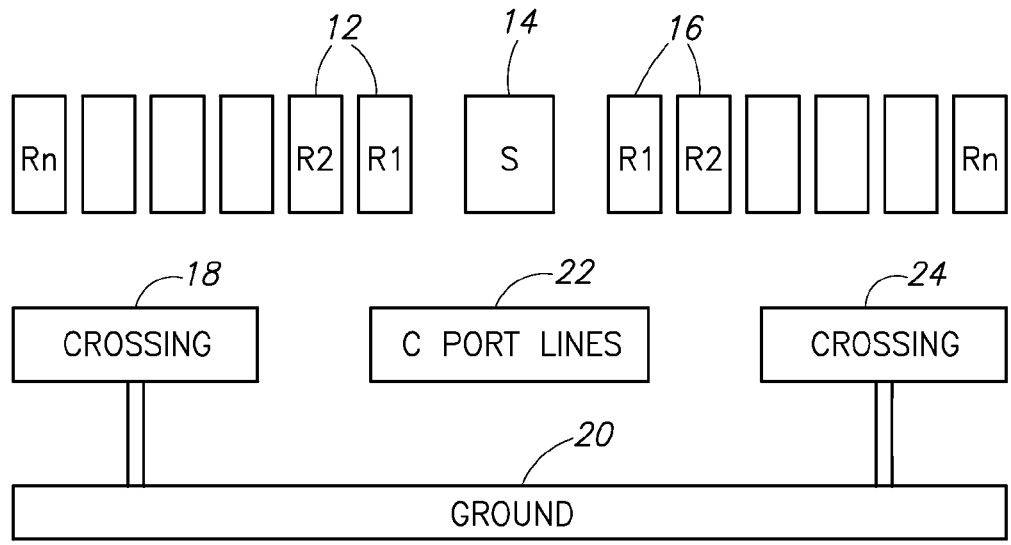
FIG. 1 is a diagram illustrating a cross-sectional view of an example embodiment of the variable transmission line of the present invention.

A diagram illustrating a cross-sectional view of an example embodiment of the variable transmission line of the present invention is shown in FIG. 1. The general two-dimensional (2D) plan, generally referenced 10, comprises a signal line (S) 14, a plurality of side shields (R1, R2, . . . , Rn) 12, 16 on either side of the signal line 14, a bottom ground 20, crossing lines 18, 24 and capacitor port (C port) lines 22. The C port lines are effective to modify the capacitance which is significantly changed when a C port line is coupled to ground. The one or more side shields are effective to modify the inductance L of the transmission line by controlling the return current through the transmission line.

Figure 2:
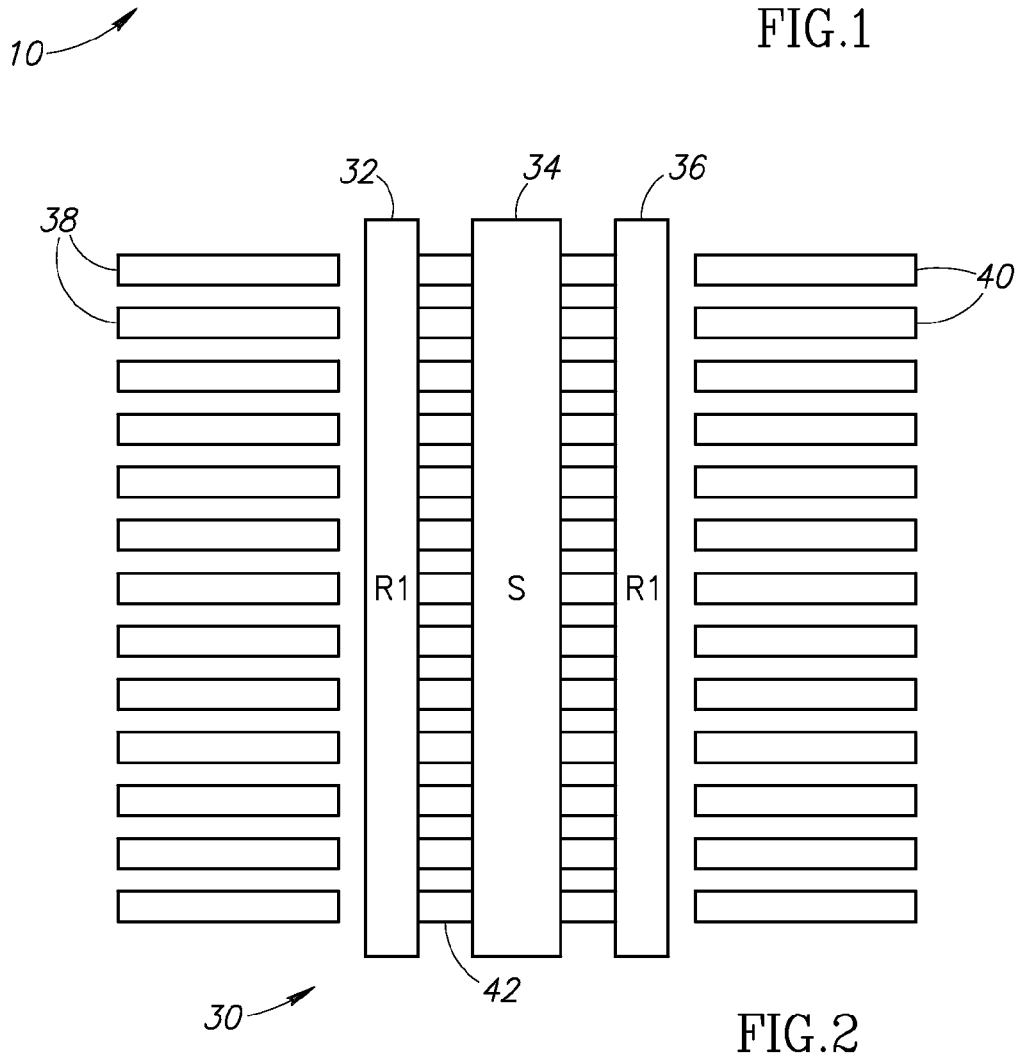
FIG. 2 is a diagram illustrating a top-plan view of an example embodiment of the variable transmission line of the present invention.

A diagram illustrating a top-plan view of an example embodiment of the variable transmission line of the present invention is shown in FIG. 2. The two-dimensional (2D) plan, generally referenced 30, comprises a signal line (S) 34, side shields (R1) 32, 36 on either side of the signal line 34, a bottom ground (not shown), crossing lines 38, 40 and capacitor port (C port) lines 42. Note that for clarity sake the structure in FIG. 2 shows only one side shield R1 on either side of the signal line. It is appreciated, that any number of side shield lines may be used.

The structures shown in FIGS. 1 and 2 enable a digitally controlled, independent modification of both the capacitance and the inductance of the structure. This enables the entire functional space of the variable transmission line to be covered. For example, the effective electrical length of the device can be modified while the impedance is kept constant. In addition, it is possible to only the modify the capacitance while keeping the inductance constant, as well as modifying the inductance while keeping the capacitance constant, etc.

In one embodiment, the capacitance is modified by connecting zero or more C port lines either to ground or to a floating potential. The C port lines are placed physically close and orthogonal to the signal wire of the transmission line. Further, the mechanism provides for the grouping of the orthogonal wires (i.e. C port lines) thereby enabling more accurate modeling of variable length transmission lines.

In one embodiment, the inductance of the variable transmission line structure is modified by switching the return current of the transmission line between several side shielding wires. This effectively changes the loop area and the resulting inductance per unit length. The change of capacitance in this case, however, is negligible. This creates a variable transmission line whose capacitance and inductance can be independently tuned.

Note that the characteristic impedance $Z_o$ of the variable transmission line is a function of the capacitance C and inductance L only and is given in Equation 1 below. This assumes that the skin effect resistance losses and silicon losses are sufficiently low, which is justified in the high frequencies used in millimeter wave design.

$$Z_o = \sqrt{L/C} \quad (1)$$

The variation of capacitance or inductance leads to a variation in characteristic impedance of the transmission line. The tuning range of characteristic impedance is related to the range of its variation.

In many practical cases capacitance only variation may be sufficient to get a wide tuning range for the characteristic impedance of the transmission line. In this case, only the C port line needs to be used while keeping the side shields constant. By grounding or floating the crossing lines the variation of capacitance and resulting variation in characteristic impedance is achieved. The structures of variable transmission lines with capacitance variation only presented here are convenient for compact modeling of such structures.

Figure 3:
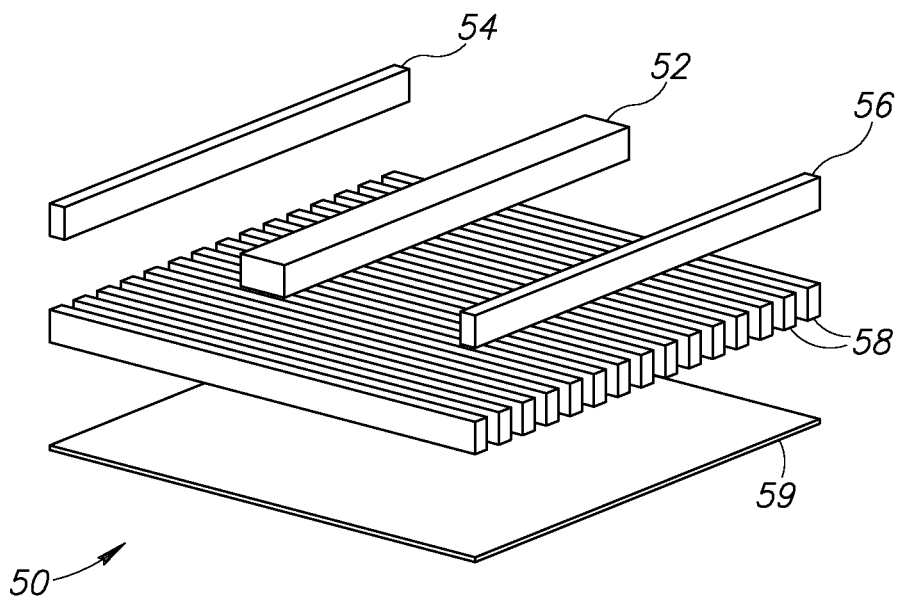
FIG. 3 is a diagram illustrating a perspective view of an example embodiment of the variable transmission line of the present invention incorporating long C port lines.

Several example 3D diagrams of variable transmission line structures are presented infra. A diagram illustrating a perspective view of an example embodiment of the variable transmission line of the present invention incorporating long C port lines is shown in FIG. 3. The variable transmission line structure, generally referenced 50, comprises a signal line 52, side shields 54, 46, long C port lines 58 and ground plane 59. The long C port lines in this embodiment extend under the signal line and the side shields.

Figure 4:
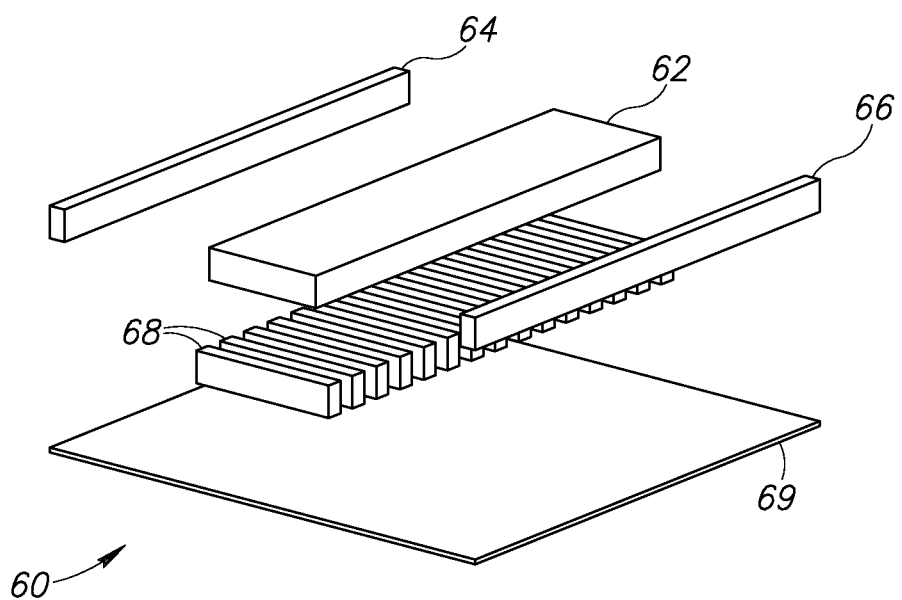
FIG. 4 is a diagram illustrating a perspective view of an example embodiment of the variable transmission line of the present invention incorporating short C port lines.

A diagram illustrating a perspective view of an example embodiment of the variable transmission line of the present invention incorporating short C port lines is shown in FIG. 4. The variable transmission line structure, generally referenced 60, comprises a signal line 62, side shields 64, 66, short C port lines 68 and ground plane 69. The short C port lines in this embodiment extend under the signal line only and do not extend to the side shields.

Note that the variable transmission line structures shown in FIGS. 3 and 4 comprise crossing lines which extend only under the signal line or under the signal line and side shields. In one embodiment, the signal line may comprise the highest metal layer of the given back-end-of-line (BEOL) metal-dielectric stack in order to be able to achieve a maximum possible characteristic impedance. The transmission line structure with long C port lines (FIG. 3) has a smaller tuning range for the characteristic impedance compared with the structure with short C port lines (FIG. 4).

Short C port lines increase the tuning range considerably since their capacitance to ground is much lower and hence the floating potential of the shorter C port lines is closer to the signal potential and further from the ground potential. When the C port lines are switched to their ground potential short and long C port lines behave approximately the same.

The connection of long C port lines to ground (for switching purposes), however, may be simpler since it can be done beyond the side shields. In the case of short C port lines (FIG. 4) the connection of the short C port lines to the switching transistors is achieved using vias going down through holes in the bottom ground plane down to the silicon surface.

The vias which connect between the C port lines and the switching transistors below (which switch the C port lines from the floating to grounded state) have a detrimental effect on the tuning range. This is due to the fact that the vias have relatively large capacitance to the bottom ground plane and therefore they reduce the C port lines potential in its floating state down to the ground potential. For smaller overall length of the variable transmission line, this via effect becomes stronger since there are more such vias per unit length.

In the structure of FIG. 3, the long C port line length has residual capacitance when in the floating state (effectively adding capacitance to the side shields) which limits the tuning range of the transmission line. Use of short C port lines in the structure of FIG. 4 (described below) corrects for this. The shorted C port line, however, is more sensitive to the actual manner in this the C port line is connected to ground.

Figure 5:
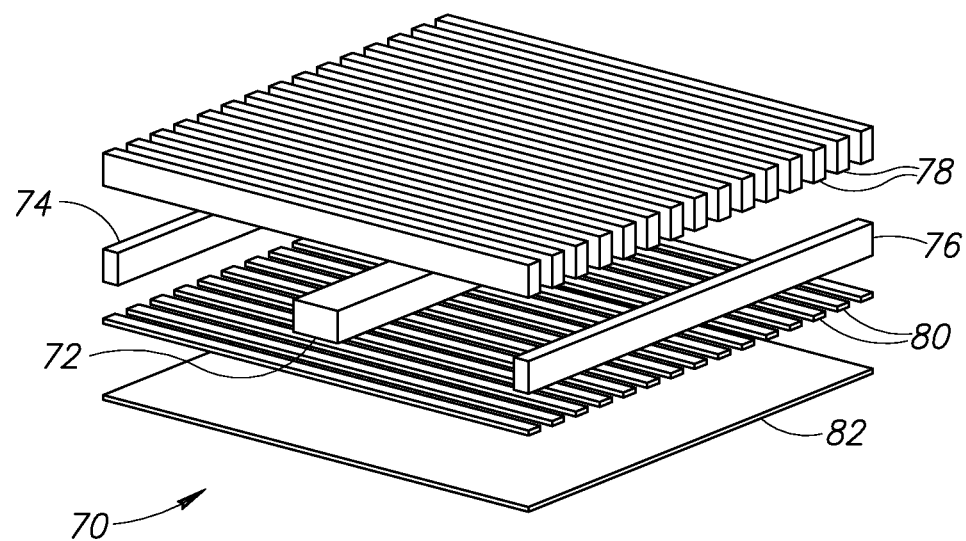
FIG. 5 is a diagram illustrating a perspective view of an example embodiment of the variable transmission line of the present invention incorporating long C port lines both under and over the signal line.

In an alternative embodiment, the crossing lines and C port lines may be not only under the signal line as in FIGS. 3 and 4 but over the signal line as well. Structures with double C port lines under and over the signal line are presented below. A diagram illustrating a perspective view of an example embodiment of the variable transmission line of the present invention incorporating long C port lines both under and over the signal line is shown in FIG. 5. The variable transmission line structure, generally referenced 70, comprises a signal line 72, side shields 74, 76, long C port lines 80 below the signal line and long C port lines 78 above the signal line, and ground plane 82. Note that the long C port lines in this example structure extend both under and over the signal line and side shields.

Figure 6:
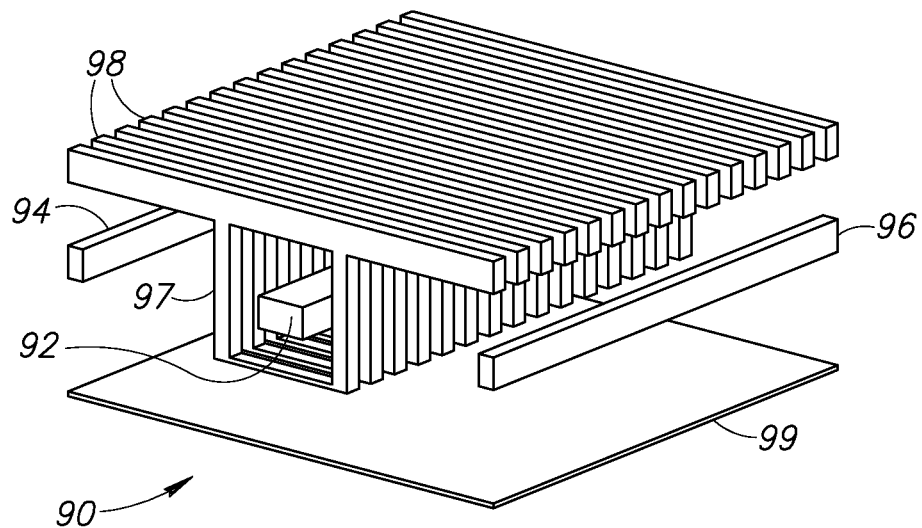
FIG. 6 is a diagram illustrating a perspective view of an example embodiment of the variable transmission line of the present invention incorporating short C port lines under the signal line and long C port lines over the signal line which form a tunnel structure.

A diagram illustrating a perspective view of an example embodiment of the variable transmission line of the present invention incorporating short C port lines under the signal line and long C port lines over the signal line which form a tunnel structure is shown in FIG. 6. The variable transmission line structure, generally referenced 90, comprises a signal line 92, side shields 94, 96, long C port lines 98 that extend above the signal line and side shields 94, 96, short C port lines that extend below and to the sides of the signal line 97, and ground plane 99. Note that the long C port lines in this example structure extend over the signal line and side shields and C port lines that extend under the signal line. Both long and short C port lines are connected to form a tunnel like structure surrounding the signal line.

Use of double C port lines significantly increases the tuning range of the characteristic impedance of the transmission line. A disadvantage, however, is that the signal layer cannot be the highest metal layer in the given back-end-of-line (BEOL) metal-dielectric stack option and thus the highest characteristic impedance cannot be reached. The tuning range of the characteristic impedance of the structure (FIG. 6) is larger than the tuning range of the structure of FIG. 5. In both cases, connection of the C port lines to the ground is relatively simple (i.e. connection beyond the side shields).

It is noted that the two layers of C port lines are not necessarily identical in that any pattern and other characteristics may be used for each C port line later. The addition of a second layer provides significantly more tenability for the transmission line at the cost of using an additional metal layer.

Figure 7:
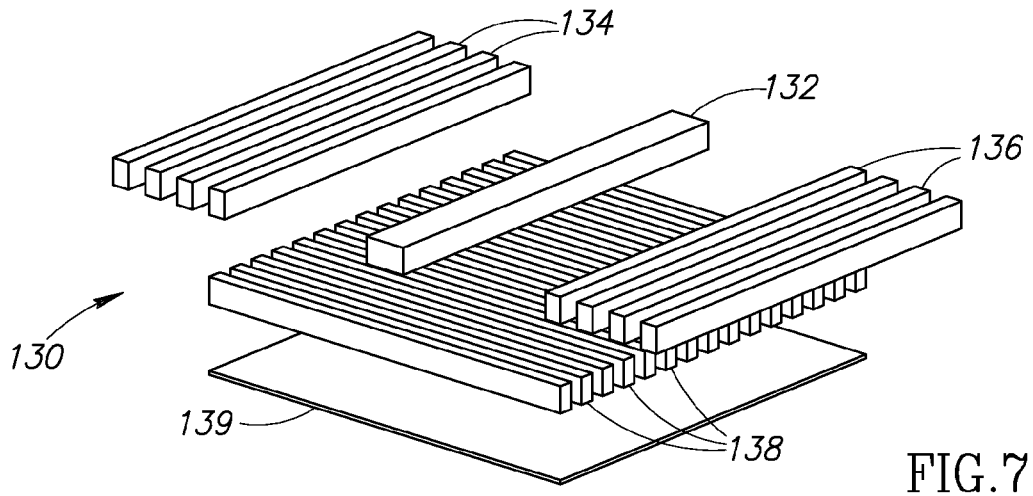
FIG. 7 is a diagram illustrating a perspective view of an example embodiment of the variable transmission line of the present invention incorporating long C port lines and a plurality of side shields.

A diagram illustrating a perspective view of an example embodiment of the variable transmission line of the present invention incorporating long C port lines and a plurality of side shields is shown in FIG. 7. The variable transmission line structure, generally referenced 130, comprises a signal line 132, a plurality of side shields 134 on one side of the signal line and another plurality of side shields 136 on the other side of the signal line, long C port lines 138 below the signal line and ground plane 139. Note that the long C port lines in this example structure extend both under and over the signal line and side shields. As described supra, the multiple side shields function to modify the inductance L of the transmission line by controlling the return current through the transmission line.

Figure 8:
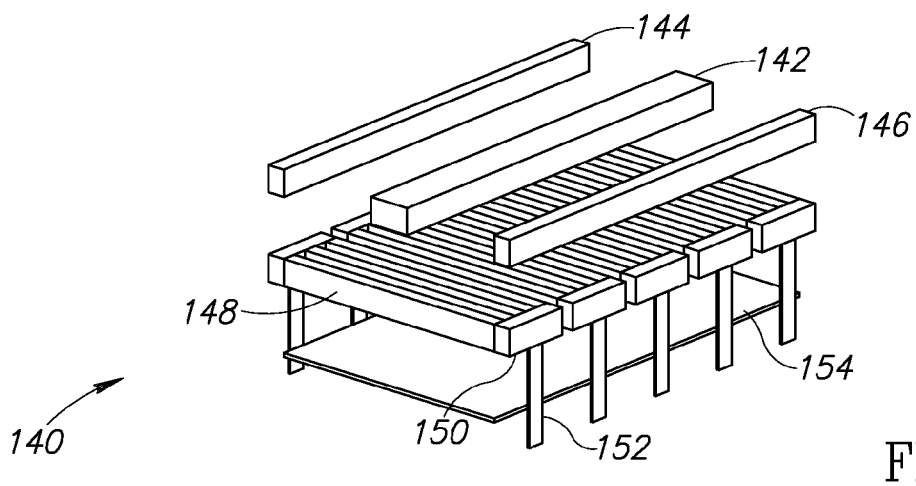
FIG. 8 is a diagram illustrating a perspective view of an example embodiment of the variable transmission line of the present invention incorporating connections to transistors from the sides of C port lines.

A diagram illustrating a perspective view of an example embodiment of the variable transmission line of the present invention incorporating connections to transistors from the sides of C port lines is shown in FIG. 8. The variable transmission line structure, generally referenced 140, comprises a signal line 142, side shields 144, 146, C port lines 148 below the signal line and ground plane 154. The C port lines 148 are connected to transistors 150 and vias 152 to ground. One or more C port lines are grouped together and either left floating or switched to ground as a group. In this example, the C port lines are connected in groups of three lines for each transistor connected to ground. It is appreciated that any number of C port lines may be grouped together depending on the implementation.

Figure 9:
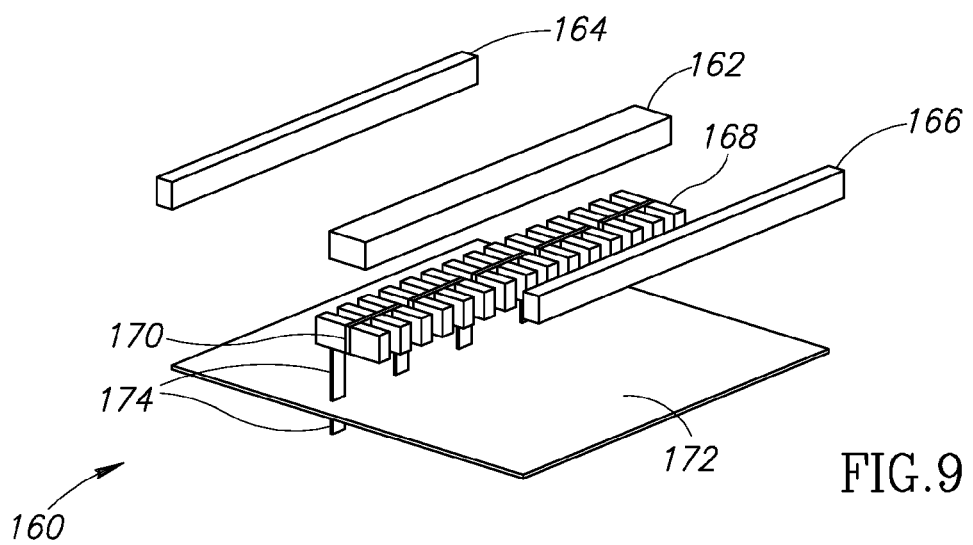
FIG. 9 is a diagram illustrating a perspective view of an example embodiment of the variable transmission line of the present invention incorporating connections to transistors from the center of C port lines.

A diagram illustrating a perspective view of an example embodiment of the variable transmission line of the present invention incorporating connections to transistors from the center of C port lines is shown in FIG. 9. The variable transmission line structure, generally referenced 160, comprises a signal line 162, side shields 164, 166, C port lines 168 and ground plane 172. The C port lines 168 are connected to transistors 170 and vias 174 to ground. One or more C port lines are grouped together and either left floating or switched to ground as a group. In this example, the C port lines are connected in groups of three lines for each transistor connected to ground. It is appreciated that any number of C port lines may be grouped together depending on the implementation.

Modeling of Variable Transmission Line Structures

The technique of grouping C port lines as provided by the present invention will now be described in more detail. In order to enable compact and accurate modeling of the capacitance variable portion of the transmission line, the physical density of the orthogonal C port lines is kept constant when changing the overall transmission line length. Namely, the same number of C port lines per unit length is maintained.

Let us define a basic transmission line modeling element, which comprises, for example, 15 crossing lines with width='wcr' and spacing='scr', where wcr and scr are arbitrary fixed values preferably equal to minimum design rule values. If the total length of the variable transmission line comprises exactly an N number of such basic transmission line elements then we have a total of 15×N C port lines. We then group these into 15 groups as follows: (1) connect together the first N ports (group number 1); (2) connect together the next N ports: N+1 . . . 2N (group number 2); and (3) connect together the last N ports: N*14+1 . . . N*15 (group number 15).

Figure 10:
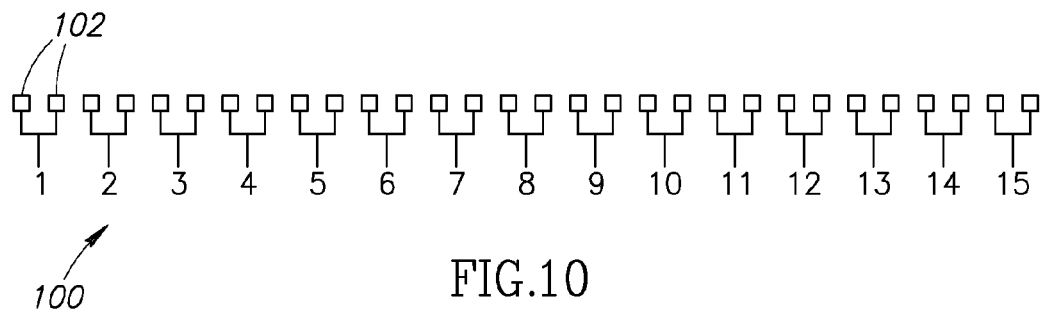
FIG. 10 is a diagram illustrating a an example of a plurality of groups for every two C ports together.

A diagram illustrating an example of a plurality of groups (e.g., 15) for every two C ports together (N=2) is shown in FIG. 10. In this example, the grouping, generally referenced 100, comprises a plurality of groups (e.g., 15), each comprising two (N=2) C port lines 102. If the total length of the variable transmission line comprises N number of basic transmission line elements plus a portion of basic transmission line then in one embodiment, a linear approximation can be used thus maintaining 15 total groups.

In one embodiment, the technique for gradually switching the 15 groups from a "floating" state to a "grounded" state is to follow a thermometer code sequence as shown below:

```
000000000000000
100000000000000
110000000000000
111000000000000
...
...
...
111111111111111
```

Note that in the thermometer code sequences given above a '0' denotes the ground state and a '1' denotes the floating state.

Figure 11:
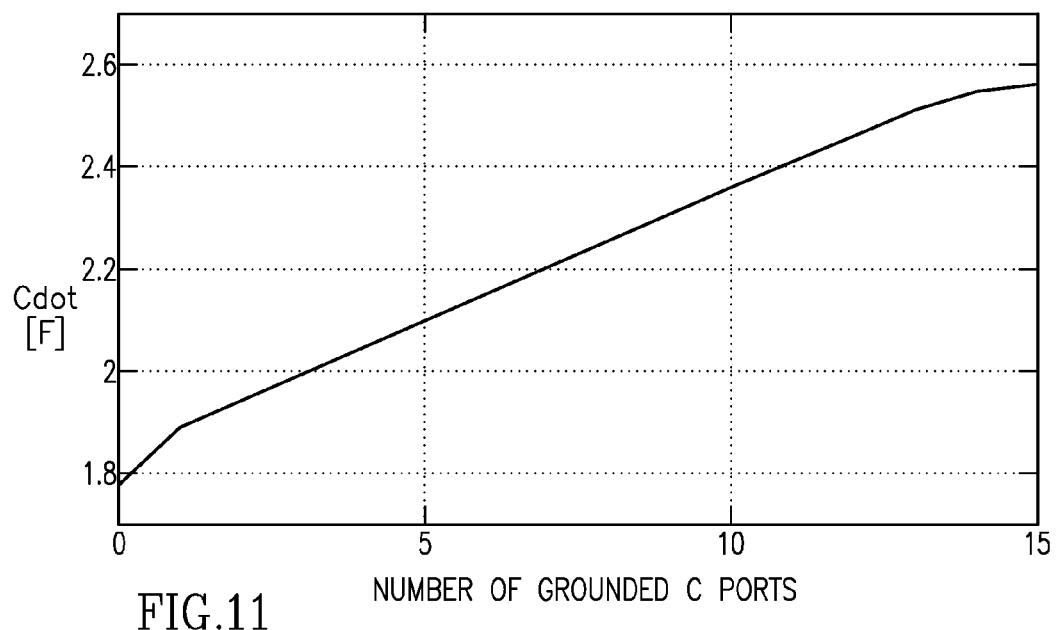
FIG. 11 is a graph illustrating the total capacitance dependency on the number of grounded C ports.

The total capacitance of the variable transmission line changes substantially linearly (except the first and the last steps). A graph illustrating the total capacitance dependency on the number of grounded C ports is shown in FIG. 11. Following the thermometer code approach, described above we obtain a discontinuity in the impedance across the transmission line in the interface between the part in which the C port lines are floating and the part in which the C port lines are grounded. This does not have much of an impact since in the worst case the relatively small impedance change is averaged over a transmission line length of a quarter wavelength. Note that preferably, transmission line devices longer than a quarter of a wavelength are avoided in order to prevent resonances.

Alternatively, a different code can be followed which effectively distributes the grounded and floating C port lines more uniformly across the transmission line thereby maintaining a uniform impedance across the transmission line. It has been found, however, that following such a uniform code generally yields less linearity in the variation of capacitance.

Changing the number of grounded C port lines from 0 to 15 (wherein the remaining C port lines are left floating), in the example provided supra, provides 16 values of capacitance and thus 16 values of characteristic impedance for a given variable transmission line.

The compact modeling technique provided for the above described transmission line structure is a natural extension of modeling methodology for fixed microstrip transmission lines. The variable transmission line is modeled separately for the variable capacitance part and for the variable inductance part. Note that the model presented herein only covers the variable capacitance part.

In one embodiment, the C port lines are modeled using a capacitance matrix wherein each C port line has mutual capacitances to each of the other C port lines as well as to the signal line and to ground. Note that ground comprises, for example, both the side shields 74, 76 and the bottom ground plane 82 (FIG. 5).

Figure 12:
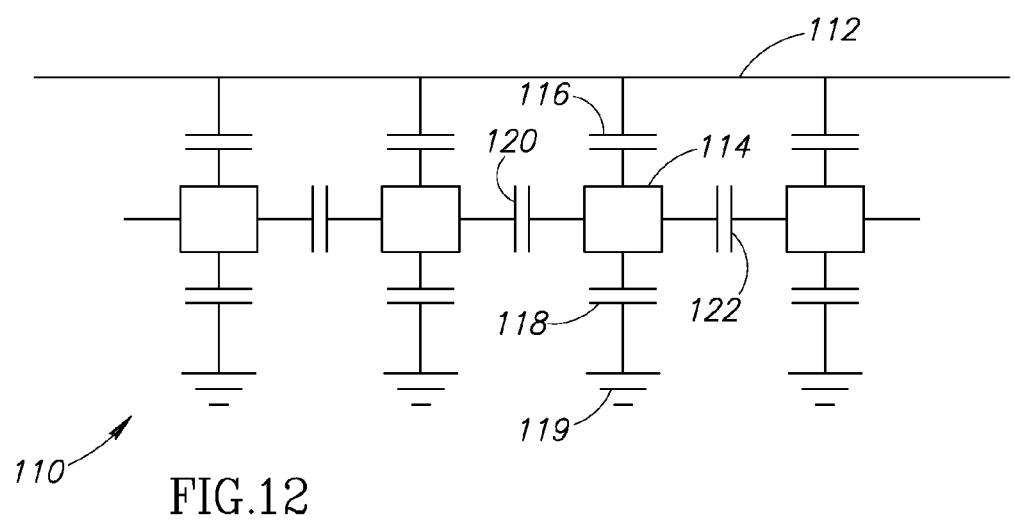
FIG. 12 is a diagram illustrating an example equivalent network for reduced capacitance matrix calculation for the C ports.

The model is significantly simplified by reducing the capacitance matrix into a five diagonal matrix, in which each C port line has mutual capacitance only to its nearest neighbors, the signal line and to ground. A diagram illustrating an example equivalent network for reduced capacitance matrix calculation for the C ports is shown in FIG. 12. The equivalent network, generally referenced 110, comprises a plurality of C port lines 114 that are capacitively coupled by capacitors 120, 122 to its nearest neighbors, and capacitively coupled by capacitor 116 to the signal line 112 and capacitively coupled by capacitor 118 to ground 119.

A further simplification can be made by assuming that the mutual capacitance to the nearest neighbors has the same value for any C port line except for the two C port lines on the two ends of the transmission line. In order to assume a constant value we maintain the physical density of the C port lines to be constant across the variable transmission line device as well as keep this same density when changing the overall variable transmission line length.

The variable inductance part of the transmission line is modeled using an appropriate inductance matrix. It should be noted that, in one embodiment, the inductance matrix itself can be highly frequency dependent.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A variable transmission line, comprising:
    a semiconductor substrate;
    a signal line;
    a first plurality of capacitor ports below said signal line, each capacitor port operative to be connected to either a bottom ground plane or a floating potential;
    one or more side shield wires to modify inductance of the signal line, wherein the first plurality of capacitor ports are not physically coupled to the one or more side shield wires such that each of capacitance and inductance of the signal line can be independently tuned; and
    wherein said signal line is digitally tuned via a tuning signal that connects one or more of the first plurality of capacitor ports to either the bottom ground plane or the floating potential.

2. The variable transmission line according to claim 1, wherein the capacitance of said signal line is modified by connecting one or more capacitor ports of the first plurality to either the bottom ground plane or the floating potential.

3. The variable transmission line according to claim 1, wherein variable inductance of said signal line is modeled using an inductance matrix.

4. The variable transmission line according to claim 1, wherein said first plurality of capacitor ports is oriented orthogonal to said signal line.

5. The variable transmission line according to claim 1, wherein the inductance of said signal line is modified by switching a return current of said signal line between said one or more side shield wires.

6. The variable transmission line according to claim 1, wherein switching a return current of said signal line between said one or more side shield wires is effective to change a loop area and resulting inductance per unit length.

7. The transmission line according to claim 1, further comprising a second plurality of capacitor ports above said signal line.

8. The variable transmission line according to claim 1, wherein the first plurality of capacitor ports of said signal line are modeled utilizing a capacitance matrix whereby each capacitor port has mutual capacitances to each of the other capacitor ports as well as to the signal line and the bottom ground plane.

9. The variable transmission line according to claim 8, wherein said capacitance matrix is reduced to a 5-diagonal matrix in which each capacitor port has mutual capacitance only to its nearest neighbors and to the signal line and the bottom ground plane.

10. The variable transmission line according to claim 8, wherein a constant value is maintained for said first plurality of capacitor ports by keeping the physical density of said first plurality of capacitor ports constant across the variable transmission line device when changing the overall signal line length.

11. The variable transmission line according to claim 1 wherein said signal line is modeled by maintaining a constant physical density of said capacitor ports regardless of the length of said signal line.

12. The variable transmission line according to claim 11, wherein said signal line is modeled by maintaining a constant number of said first plurality of capacitor ports per unit length of said signal line.

13. A variable transmission line, comprising:
    a semiconductor substrate;

a signal line;

a first plurality of capacitor ports below said signal line, each capacitor port operative to be connected to either a bottom ground plane or a floating potential;

one or more side shield wires surrounding said signal line to modify inductance of the signal line, wherein the first plurality of capacitor ports are not physically coupled to the one or more side shield wires such that each of capacitance and inductance of the signal line can be independently tuned;

wherein characteristic impedance of said signal line is tuned by connecting each capacitor port of the first plurality to either the bottom ground plane or the floating potential and maintaining constant said one or more side shield wires; and wherein said signal line is digitally tuned via a tuning signal that connects one or more of the first plurality of capacitor ports to either ground or a floating potential.

14. The variable transmission line according to claim 13, wherein said signal line is modeled by maintaining a constant physical density of said first plurality of capacitor ports regardless of the length of said signal line.

15. The variable transmission line according to claim 13, wherein said signal line is modeled by maintaining a constant number of said first plurality of capacitor ports per unit length of said signal line.

16. The transmission line according to claim 13, wherein said capacitor ports comprise long capacitor ports, wherein the long capacitor ports extend across the one or more side shield wires.

17. The variable transmission line according to claim 13, wherein said first plurality of capacitor ports comprise short capacitor ports, wherein the short capacitor ports do not extend across the one or more side shield wires.

\* \* \* \* \*